United States Patent [19]

Foreman et al.

[11] Patent Number: 5,428,288
[45] Date of Patent: Jun. 27, 1995

[54] MICROELECTRIC MONITORING DEVICE

[75] Inventors: Kevin G. Foreman, Sandia Park; Paul J. Miller, Albuquerque; Willie C. Kiser, Rio Rancho, all of N. Mex.

[73] Assignee: TRW Inc., Redondo Beach, Calif.

[21] Appl. No.: 262,410

[22] Filed: Jun. 20, 1994

Related U.S. Application Data

[63] Continuation of Ser. No. 998,332, Dec. 30, 1992, abandoned, which is a continuation-in-part of Ser. No. 938,111, Aug. 31, 1992, Pat. No. 5,290,191, which is a continuation-in-part of Ser. No. 895,148, Jun. 5, 1992, Pat. No. 5,181,859, which is a continuation of Ser. No. 694,262, Apr. 29, 1991, abandoned.

[51] Int. Cl.$^6$ .......................... G01R 21/06; H01R 4/66
[52] U.S. Cl. ..................................... 324/142; 439/225
[58] Field of Search .................... 324/142, 103 P, 141; 439/225

[56] References Cited

U.S. PATENT DOCUMENTS

| | | | |
|---|---|---|---|
| T947,007 | 6/1975 | Krumreich et al. | 439/225 |
| 2,073,880 | 3/1937 | Robinson | 439/225 |
| 2,760,128 | 8/1956 | Colby | 439/108 |
| 2,944,330 | 7/1960 | Swick | 439/78 |
| 3,072,873 | 1/1963 | Traher | 439/225 |
| 3,500,194 | 3/1970 | Smith | 340/664 |
| 3,569,915 | 3/1971 | Langham et al. | 439/608 |
| 3,670,292 | 6/1972 | Tracy | 439/608 |
| 3,736,379 | 5/1973 | Kagan | 439/225 |
| 3,753,261 | 8/1973 | Thaxton | 439/490 |
| 3,821,686 | 6/1974 | Harnden, Jr. | 439/597 |
| 3,825,874 | 7/1974 | Peverill | 439/579 |
| 3,852,700 | 12/1974 | Haws | 439/225 |
| 3,905,013 | 9/1975 | Lee | 439/366 |
| 4,002,397 | 1/1977 | Wang et al. | 439/225 |
| 4,056,299 | 11/1977 | Paige | 439/225 |
| 4,082,394 | 4/1978 | Gedney et al. | 439/69 |
| 4,326,765 | 4/1982 | Brancaleone | 439/225 |
| 4,330,166 | 5/1982 | Cooper et al. | 439/609 |
| 4,362,350 | 12/1982 | von Harz | 439/608 |
| 4,407,552 | 10/1983 | Watanabe et al. | 439/608 |
| 4,415,218 | 11/1983 | McKenzie | 439/620 |
| 4,440,463 | 4/1984 | Gliha, Jr. et al. | 439/608 |
| 4,522,455 | 6/1985 | Johnson | 439/225 |
| 4,558,275 | 12/1985 | Borowy et al. | 324/103 P |
| 4,580,866 | 4/1986 | Hagner | 439/620 |
| 4,673,237 | 6/1987 | Wadsworth | 439/225 |
| 4,676,564 | 6/1987 | Mitchell, Jr. | 439/225 |
| 4,709,253 | 11/1987 | Walters | 257/603 |

(List continued on next page.)

FOREIGN PATENT DOCUMENTS 0246305  1/1926 United Kingdom .

OTHER PUBLICATIONS

Pulse-Guard "Pulse-Guard Model 'PGD' Submillimeter Suppressor Arrays", 2 sheets date believed to be Oct. 1992 (Ex. E).
Pulse-Guard "The Super ESD Suppressor For I/O Connectors", 4 sheets, date believed to be Feb. 1993 (Ex. F).
Pulse-Guard "Transient Overvoltage Protection", 1 pg, date believed to be Mar. 1992. (Ex. C).
Hyatt, "A Technique for Optimizing ESD, EMP and Lightning Protection", pp. 393–408, date believed to be fall 1992. (Ex. B).
G&H Technology, Inc., "Pulse-Guard" literature including Sub-Millimeter model, 10 sheets, date believed to be Aug. 1992. (Ex. D).
Archer, "Heavy Duty Spike Protector". 1993 (Ex. A).

Primary Examiner—Ernest F. Karlsen
Attorney, Agent, or Firm—G. Gregory Schivley; Robert W. Keller

[57] ABSTRACT

A sensor device in the form of a thin, generally flat substrate which fits between an electrical plug and an electrical outlet while permitting normal mated engagement therebetween. The substrate preferably includes at least one microelectronic device for detecting and storing electrical characteristics of signals flowing from the outlet to the plug.

20 Claims, 2 Drawing Sheets

U.S. PATENT DOCUMENTS

| | | | |
|---|---|---|---|
| 4,717,349 | 1/1988 | Johnson | 439/225 |
| 4,726,638 | 2/1988 | Farrar et al. | 439/620 |
| 4,729,743 | 3/1988 | Farrar et al. | 439/620 |
| 4,729,752 | 3/1988 | Dawson, Jr. et al. | 439/620 |
| 4,813,891 | 3/1989 | Walters et al. | 439/620 |
| 4,820,174 | 4/1989 | Farrar et al. | 439/608 |
| 4,846,705 | 7/1989 | Brunnenmeyer | 439/78 |
| 4,979,070 | 12/1990 | Bodkin | 340/650 |
| 4,979,904 | 12/1990 | Francis | 439/108 |
| 4,992,333 | 2/1991 | Hyatt | 361/117 |
| 5,092,788 | 3/1992 | Pristupa, Jr. et al. | 439/225 |
| 5,118,302 | 6/1992 | Fussell et al. | 439/225 |
| 5,134,252 | 7/1992 | Himeno et al. | 439/497 |
| 5,181,859 | 1/1993 | Foreman et al. | 439/225 |
| 5,183,698 | 2/1993 | Stephenson et al. | 174/250 |
| 5,290,191 | 3/1994 | Foreman et al. | 439/225 |

MICROELECTRIC MONITORING DEVICE

This is a continuation of U.S. patent application Ser. No. 07/998,332, filed Dec. 30, 1992, now abandoned which is a continuation-in-part application of U.S. Ser. No. 07/938,111, filed Aug. 31, 1992, now U.S. Pat. No. 5,290,191, which is a continuation-in-part application of U.S. Ser. No. 07/895,148, filed Jun. 5, 1992, now U.S. Pat. No. 5,181,859, which is a continuation application of U.S. Ser. No. 07/694,262, filed Apr. 29, 1991, now abandoned.

BACKGROUND OF THE INVENTION

1. Technical Field

This invention relates to sensors and, more particularly, to power monitoring devices.

2. Discussion

A variety of applications exist for sensor devices which can detect characteristics of the electrical signals supplied by conventional electrical outlets. One such application is to detect the quality of the power supplied through the electrical outlet for powering electrical equipment. It is known that optimum performance of certain electrical equipment is conditioned on the reception of clean power, with spikes, sag, swell, harmonic distortion and other factors collectively referred to as power quality characteristics, held within acceptable limits.

Power quality monitors have been used in the past to detect power quality characteristics. However, they are generally bulky devices which are relatively expensive and difficult to install. Therefore, while it would be desirable in many instances to monitor power quality at a multitude of locations within a facility, it is impractical to do so because of cost and manpower limitations of the known power quality monitors.

SUMMARY OF THE INVENTION

In accordance with the teachings of the present invention, a wafer-like substrate is provided with holes therein aligned with the pins of the electrical plug for powering a variety of electrical equipment. The substrate carries at least one microelectronic device, such as a microprocessor. The substrate is sufficiently thin to allow the electrical plug to be normally mated with the electrical outlet. In operation, provision is made for using the microelectronic device to collect data about the electrical signals flowing from the outlet to the plug and then to the electrical equipment. This data can later be retrieved for further analysis, or collected in real-time, as desired.

BRIEF DESCRIPTION OF THE DRAWINGS

The various advantages of the present invention will become apparent to those skilled in the art after reading the following specification and by reference to the drawings in which.

DESCRIPTION OF THE PREFERRED EMBODIMENT

Figure 1:
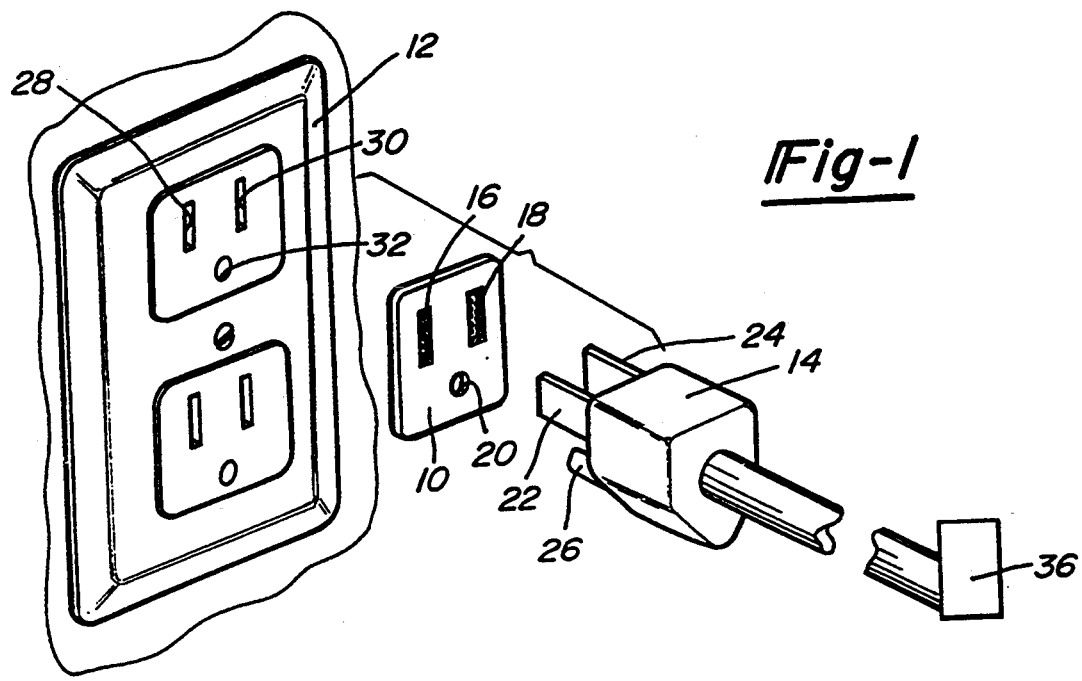
FIG. 1 is an exploded perspective view of the sensor device of the present invention, an electrical outlet and an electrical plug.

In FIG. 1, the sensor device 10 of the present invention is shown in conjunction with a conventional electrical outlet 12 and conventional three-pronged electrical plug 14. Sensor device 10 includes holes 16, 18 and 20 which are aligned with the hot, neutral and ground pins 22, 24 and 26 of plug 14, respectively. Likewise, holes 16, 18 and 20 are aligned with the female sockets 28, and 32, respectively, of outlet 12.

Figure 3:
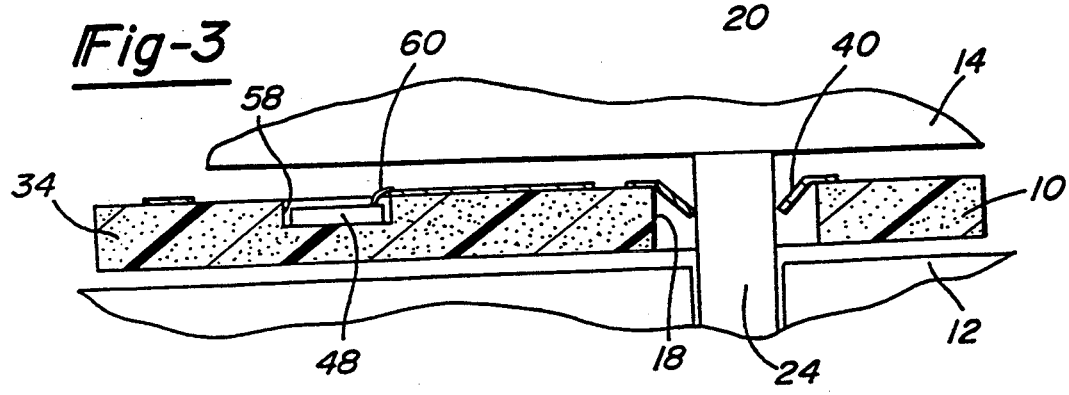
FIG. 3 is a partial cross sectional view taken along the lines 3—3 of FIG. 2 which further illustrates the sensor device sandwiched between the plug and outlet when mated.

Sensor device 10 includes a generally flat substrate which is sufficiently thin to allow the plug 14 to make normal mated connection with outlet 12 as shown in FIG. 3. In this embodiment, substrate 34 is a rigid nonconductive printed circuit board to which discrete components are mounted. However, it should be understood that substrate 34 can take the form of a plastic material which supports and encases a thin flex-circuit, such as Kapton, upon which the components are mounted and electrically connected. Substrate 34 has a thickness which is preferably less than about 15 percent the length of the plug pins in order to permit normal mated connection with outlet 12. In this example, substrate 34 is about 0.015-0.030 inch thick and its outer periphery is generally coextensive with the end face of plug 14.

Circuitry is provided on substrate 34 for performing the desired detection and storage of data containing information about the electrical signal characteristics flowing from outlet 12 through plug 14 and then to the electrical equipment 36. The circuitry includes one or more microelectronic devices ranging from simple rectifier/analog to digital converter combinations to programmable integrated circuit devices for collecting information about the electrical signals flowing to plug 14 and for storing the data in digital form for later retrieval. Microprocessors or programmable logic arrays could be used for the more complex applications.

Figure 2:
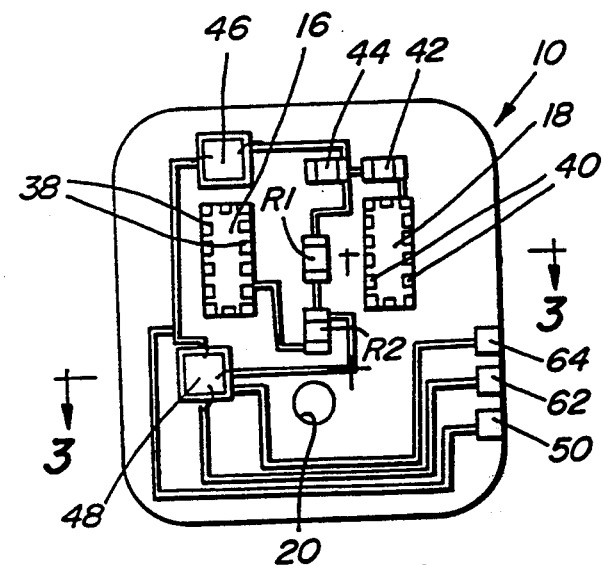
FIG. 2 is a plan view of the sensor device illustrating the layout of various components thereon.
Figure 4:
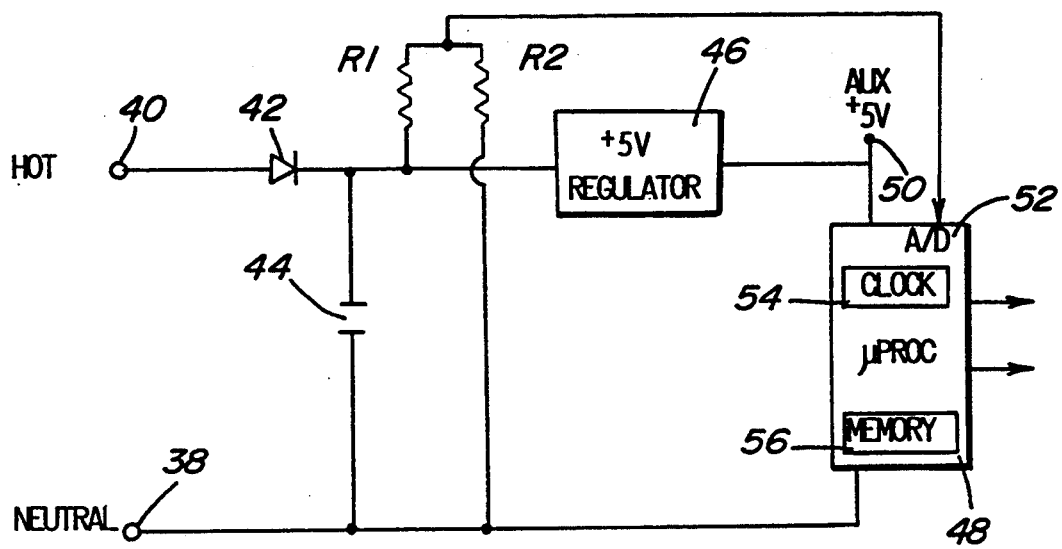
FIG. 4 is a schematic diagram of one embodiment of electrical circuitry on the sensor device.

In this particular example, the circuitry is designed to monitor the quality of the power supplied from outlet 12 through plug 14 to the electrical equipment shown schematically by the numeral 36. Examples of power quality characteristics that can be monitored include voltage spikes, sag, swell, harmonic distortion and other similar characteristics which may be desired to be monitored. In FIGS. 2 and 4 the circuitry is employed to detect the voltage levels of the supplied power on a timed basis. In such manner, it can be determined when abnormally low voltage levels have been applied to the electrical equipment 36. Thus, electrical disturbances which can affect the performance of equipment 36 can be analyzed and corrected, as needed.

As shown in FIGS. 2 and 3, the upper surface of the substrate 34 includes a plurality of conductive traces thereon. Two of the traces terminate in bendable finger contacts 38 and 40 for making electrical connection to the pins 24 and 22 when the plug 14 is mated with outlet 12. With additional reference to FIG. 4, the hot electrical contacts 40 and neutral electrical contacts 38 are connected to a diode 42 and capacitor 44 network which serves to rectify and smooth the alternating current line voltage applied to pins 22 and 24 through outlet 12. The rectified line voltage is coupled to a +5 volt regulator 46 which provides the necessary operating voltage for microprocessor 48. A resistor-divider network provided by resistors R1 and R2 is employed to suitably condition the rectified line voltage to a level compatible with the onboard analog to digital converter 52 of microprocessor 48. Microprocessor 48 is, in this example, a Motorola MC68HC11microprocessor which further includes a clock 54 and nonvolatile memory 56.

If necessary, the various components can be recessed in pockets in substrate 34 to maintain the desired thin profile for the device 10. In FIG. 3, this is illustrated by recess or pocket 58 that receives microprocessor 48. Suitable electrical connection can be made between the component and the traces on the substrate 34. In FIGS. 2 and 3 this is illustrated by a plurality of wire bonds 60. Other well known connection techniques such as Tape Automated Bonding (TAB) or "Flip-Chips" could be used, as well.

Device 10 further includes two serial data transmission output ports 62 and 64 which, along with auxiliary +5 volt input 50, terminate in pads located conveniently near an edge of the substrate 34. The auxiliary +5 volt input 50 accepts +5 volt power from the querying computer 66 (FIG. 5), to power the device's circuitry when disconnected from line power. A protective coating (not shown), such as Kapton, can be applied to the upper and lower surfaces of substrate 34 as necessary to insulate and protect the components and traces carried by the substrate.

Figure 5:
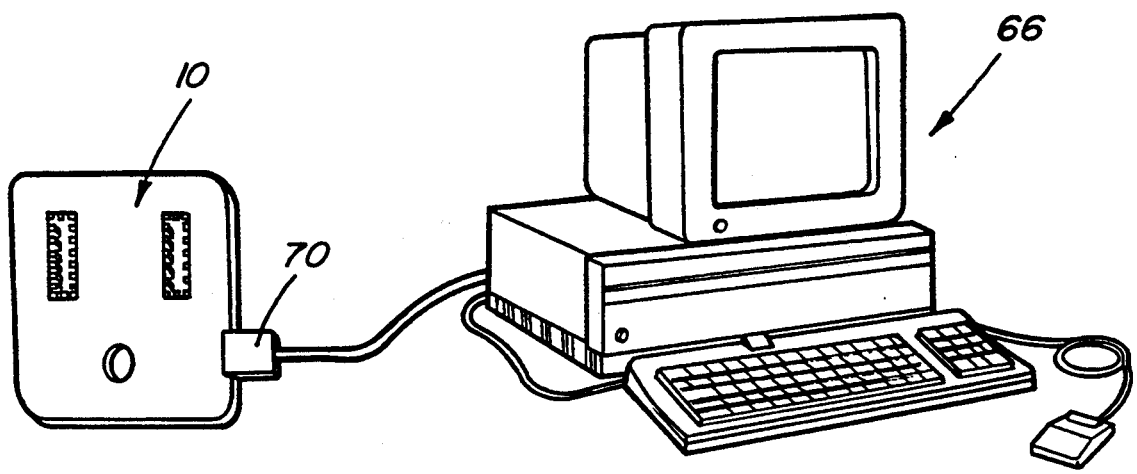
FIG. 5 is a perspective view illustrating the connection of the sensor device during retrieval of data therefrom by a computer.

In operation, the device 10 is slipped over the male pins of the electrical plug 14 which is then mated with electrical outlet 12 in the normal fashion. The circuitry on device 10 monitors the power quality supplied to equipment 36 on a time-tagged basis. The AC line voltage from outlet 12 is tapped by plug contacts 38 and 40, rectified and converted to digital form by A/D converter 52. The converted digital data is stored in memory 56 under the control of microprocessor 48. Clock 54 provides clock pulses or other suitable signals which the microprocessor 52 uses to tag the sensed characteristics with indicia of when the data sampling took place. As shown in FIG. 5, the stored data can be read from memory 56 for further analysis by computer 66. Electrical connection between device 10 and computer 66 is made by way of a suitable patch cord 68 having a connector 70 which mates with the output pads 62, 64 and 50.

It should become apparent to those skilled in the art that the present invention provides a low cost and easily installed technique for monitoring various low voltage power characteristics. No modification of existing hardware is necessary and the device 10 is small enough so that it can be easily transported to various locations for use and/or analysis of its stored data. Various modifications of the particular example just described will become apparent to those skilled in the art. For example, sensors could be included for detecting other data such as temperature, vibration and the like, instead of electrical characteristics. Therefore, no limitation is intended thereby except as defined by the following claims.

What is claimed is:

1. A sensor device for sensing electrical characteristics of signals flowing from an electrical outlet having female sockets therein for receiving male pins of an electrical plug, said sensor device comprising:
   a generally flat substrate having holes therein for receiving the pins in the electrical plug;
   at least one microelectronic device on the substrate;
   conductive means for making electrical connection between the pins of the plug as they extend through the holes in the substrate and the microelectronic device;
   memory means for storing data about the sensed electrical characteristics;
   output means for reading the stored data from the memory means;
   conductive traces on the substrate extending from the memory means to the output means;
   said substrate being sufficiently thin to permit the pins of the electrical plug to be mated in a normal fashion with the sockets in the outlet, with the substrate being sandwiched therebetween; and
   whereby the microelectronic device senses electrical characteristics of the signals flowing from the outlet to the plug.

2. The device of claim 1 wherein the microelectronic device comprises a microprocessor.

3. The device of claim 1 wherein the output means comprises a readout for reading the stored data from the memory.

4. The device of claim 1 wherein the output means comprises an output port to which external connection can be made.

5. The device of claim 2 which further comprises:
   clock means for providing time information; and
   wherein the microprocessor stores data about the sensed electrical characteristics in the memory on a time-tagged basis.

6. The sensor device of claim 5 wherein power quality characteristics are sensed.

7. The device of claim 6 which further comprises:
   rectification means for rectifying alternating current signals from the outlet; and
   analog-to-digital converter means, coupled to the rectification means, for converting the rectified signals to digital form.

8. The device of claim 1 wherein the substrate has a thickness less than about 15 percent the length of the pins of the electrical plug.

9. The device of claim 1 wherein the substrate is about 0.015–0.030 inch thick.

10. The device of claim 1 wherein the substrate is a printed circuit board to which discrete components are mounted.

11. The device of claim 10 wherein at least one component is mounted in a pocket in a surface of the substrate.

12. A sensor device for sensing electrical characteristics of signals flowing from an electrical device having female sockets therein for receiving male pins of an electrical plug, said sensor device comprising:
   a generally flat substrate having holes therein for receiving the pins in the electrical plug;
   at least one microelectronic device mounted to the substrate;
   conductive means for making electrical connection between the pins of the plug as they extend through the holes in the substrate and the microelectronic device;
   said microelectronic device including a memory for storing data about the sensed electrical characteristics;
   output means for reading the stored data from the memory;
   means for electrically connecting the microelectronic device to the output means;

said substrate being sufficiently thin to permit the pins of the electrical plug to be mated in a normal fashion with the sockets, with the substrate being sandwiched therebetween; and whereby the microelectronic device senses electrical characteristics of the signals flowing from the electrical device to the plug.

13. The device of claim 12 wherein the substrate comprises first and second major surfaces; and wherein said microelectronic device is mounted between the first and second major surfaces of the substrate.

14. The device of claim 12 wherein the means for electrically connecting comprises conductive traces on the substrate.

15. The device of claim 12 wherein the output means comprises an output port to which external connection can be made.

16. The device of claim 12 wherein the microelectronic device further includes:

clock means for providing time information; and wherein the microelectronic device stores data about the sensed electrical characteristics in the memory on a time-tagged basis.

17. The device of claim 16 wherein power quality characteristics are sensed.

18. The device of claim 16 which further includes:

rectification means for rectifying alternating current signals from the electrical device; and analog-to-digital converter means, coupled to the rectification means, for converting the rectified signals to digital form.

19. A sensor device for sensing electrical characteristics of signals flowing from an electrical device having female sockets therein for receiving male pins of an electrical plug, said sensor device comprising:

a generally flat substrate having first and second major surfaces and holes therein for receiving the pins in the electrical plug;

at least one microelectronic device mounted between the first and second major surfaces of the substrate;

conductive means for making electrical connection between the pins of the plug as they extend through the holes in the substrate and the microelectronic device;

said microelectronic device includes a memory for storing data about the sensed electrical characteristics and a clock means for providing time information such that data about the sensed electrical characteristics is stored in the memory on a time-tagged basis;

an output port to which external connection can be made for reading the stored data from the memory;

conductive traces on the substrate extending from the microelectronic device to the output port;

said substrate being sufficiently thin to permit the pins of the electrical plug to be mated in a normal fashion with the sockets in the electrical device, with the substrate being sandwiched therebetween; and whereby the microelectronic device senses electrical characteristics of the signals flowing from the electrical device to the plug.

20. The device of claim 19 which further comprises:

rectification means for rectifying alternating current signals from the electrical device; and analog-to-digital converter means, coupled to the rectification means, for converting the rectified signals to digital form.

* * * * *